United States Patent
Ye (10) Patent No.: US 8,349,669 B2
(45) Date of Patent: Jan. 8, 2013

(54) THIN FILM TRANSISTORS USING MULTIPLE ACTIVE CHANNEL LAYERS

(75) Inventor: Yan Ye, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/556,380

(22) Filed: Jul. 24, 2012

(65) Prior Publication Data

US 2012/0288994 A1 Nov. 15, 2012

Related U.S. Application Data

(62) Division of application No. 12/411,195, filed on Mar. 25, 2009, now Pat. No. 8,258,511.

(60) Provisional application No. 61/077,831, filed on Jul. 2, 2008, provisional application No. 61/117,744, filed on Nov. 25, 2008, provisional application No. 61/117,747, filed on Nov. 25, 2008.

(51) Int. Cl.
*H01L 21/00* (2006.01)
*H01L 21/84* (2006.01)

(52) U.S. Cl. ............. 438/151; 438/22; 438/48; 438/149

(58) Field of Classification Search ............ 438/22, 438/48, 128, 149, 151, 157, 283; 257/E21.09, 257/E21.414, E29.288
See application file for complete search history.

(56) References Cited

U.S. PATENT DOCUMENTS

| 4,436,770 A | 3/1984 | Nishizawa et al. |
| 4,695,432 A | 9/1987 | Colin et al. |
| 4,769,291 A | 9/1988 | Belkind et al. |
| 4,816,082 A | 3/1989 | Guha et al. |
| 4,983,360 A | 1/1991 | Merdrignac et al. |
| 5,279,679 A | 1/1994 | Murakami et al. |
| 5,346,601 A | 9/1994 | Barada et al. |
| 5,352,300 A | 10/1994 | Niwa et al. |
| 5,420,452 A | 5/1995 | Tran et al. |

(Continued)

FOREIGN PATENT DOCUMENTS

CN 1588623 A 3/2005

(Continued)

OTHER PUBLICATIONS

Toyoura et al., "Optical properties of zinc nitride formed by molten salt electrochemical process", Thin Film Solids 492 (2005), pp. 88-92.

(Continued)

*Primary Examiner* — Hung Vu
(74) *Attorney, Agent, or Firm* — Patterson & Sheridan, LLP (57) ABSTRACT

Embodiments disclosed herein generally relate to TFTs and methods of fabricating the TFTs. In TFTs, the active channel carries the current between the source and drain electrodes. By tailoring the composition of the active channel, the current can be controlled. The active channel may be divided into three layers, a gate control layer, a bulk layer, and an interface control layer. The separate layers may have different compositions. Each of the gate control, bulk and interface control layers may additionally comprise multiple layers that may have different compositions. The composition of the various layers of the active channel comprise oxygen, nitrogen, and one or more elements selected from the group consisting of zinc, indium, cadmium, tin, gallium and combinations thereof. By varying the composition among the layers, the mobility, carrier concentration and conductivity of the various layers may be controlled to produce a TFT having desired properties.

15 Claims, 3 Drawing Sheets

U.S. PATENT DOCUMENTS

| | | |
|---|---|---|
| 5,522,934 A | 6/1996 | Suzuki et al. |
| 5,571,749 A | 11/1996 | Matsuda et al. |
| 5,620,523 A | 4/1997 | Maeda et al. |
| 5,625,199 A | 4/1997 | Baumbach et al. |
| 5,668,663 A | 9/1997 | Varaprasad et al. |
| 5,683,537 A | 11/1997 | Ishii |
| 5,700,699 A | 12/1997 | Han et al. |
| 5,716,480 A | 2/1998 | Matsuyama et al. |
| 5,720,826 A | 2/1998 | Hayashi et al. |
| 5,731,856 A | 3/1998 | Kim et al. |
| 5,993,594 A | 11/1999 | Wicker et al. |
| 6,150,668 A | 11/2000 | Bao et al. |
| 6,153,013 A | 11/2000 | Sakai et al. |
| 6,153,893 A | 11/2000 | Inoue et al. |
| 6,159,763 A | 12/2000 | Sakai et al. |
| 6,180,870 B1 | 1/2001 | Sano et al. |
| 6,228,236 B1 | 5/2001 | Rosenstein et al. |
| 6,238,527 B1 | 5/2001 | Sone et al. |
| 6,329,269 B1 | 12/2001 | Hamada et al. |
| 6,388,301 B1 | 5/2002 | Tawada et al. |
| 6,458,673 B1 | 10/2002 | Cheung |
| 6,488,824 B1 | 12/2002 | Hollars et al. |
| 6,566,180 B2 | 5/2003 | Park et al. |
| 6,620,719 B1 | 9/2003 | Andry et al. |
| 6,700,057 B2 | 3/2004 | Yasuno |
| 6,746,959 B2 | 6/2004 | Lyu |
| 6,773,969 B2 * | 8/2004 | Lee et al. ............... 438/149 |
| 6,787,010 B2 | 9/2004 | Cuomo et al. |
| 6,825,134 B2 | 11/2004 | Law et al. |
| 6,881,305 B2 | 4/2005 | Black et al. |
| 6,890,803 B2 | 5/2005 | Lin et al. |
| 6,943,359 B2 | 9/2005 | Vardeny et al. |
| 6,953,947 B2 | 10/2005 | Son et al. |
| 7,026,713 B2 | 4/2006 | Hoffman et al. |
| 7,037,157 B2 | 5/2006 | Murakami et al. |
| 7,145,174 B2 | 12/2006 | Chiang et al. |
| 7,158,208 B2 | 1/2007 | De Jager et al. |
| 7,189,992 B2 | 3/2007 | Wager, III et al. |
| 7,235,810 B1 | 6/2007 | Yamazaki et al. |
| 7,297,977 B2 | 11/2007 | Hoffman et al. |
| 7,309,895 B2 | 12/2007 | Hoffman et al. |
| 7,339,187 B2 | 3/2008 | Wager, III et al. |
| 7,378,286 B2 | 5/2008 | Hsu et al. |
| 7,382,421 B2 | 6/2008 | Hoffman et al. |
| 7,601,984 B2 | 10/2009 | Sano et al. |
| 7,626,201 B2 | 12/2009 | Chiang et al. |
| 7,629,191 B2 | 12/2009 | Chiang et al. |
| 7,674,650 B2 | 3/2010 | Akimoto et al. |
| 7,750,440 B2 | 7/2010 | Yagi |
| 7,879,698 B2 | 2/2011 | Ye |
| 7,927,713 B2 | 4/2011 | Ye |
| 8,012,794 B2 | 9/2011 | Ye |
| 8,173,492 B2 * | 5/2012 | Lee et al. ............... 438/149 |
| 2002/0117719 A1 | 8/2002 | Ando et al. |
| 2002/0149053 A1 | 10/2002 | Tsunoda et al. |
| 2003/0015234 A1 | 1/2003 | Yasuno |
| 2003/0047785 A1 | 3/2003 | Kawasaki et al. |
| 2003/0049464 A1 | 3/2003 | Glenn et al. |
| 2003/0207093 A1 | 11/2003 | Tsuji et al. |
| 2004/0018797 A1 | 1/2004 | Murakami et al. |
| 2004/0092061 A1 | 5/2004 | Kawasaki et al. |
| 2004/0113098 A1 | 6/2004 | Vardeny et al. |
| 2004/0164294 A1 | 8/2004 | Son et al. |
| 2004/0175511 A1 | 9/2004 | Hartig |
| 2004/0235224 A1 | 11/2004 | Lin et al. |
| 2005/0017244 A1 | 1/2005 | Hoffman et al. |
| 2005/0028860 A1 | 2/2005 | Sano et al. |
| 2005/0062057 A1 | 3/2005 | Yamazaki et al. |
| 2005/0062409 A1 | 3/2005 | Yamazaki et al. |
| 2005/0067953 A1 | 3/2005 | Yamazaki et al. |
| 2005/0181532 A1 | 8/2005 | Patel et al. |
| 2005/0181534 A1 | 8/2005 | Yoshimi et al. |
| 2005/0233092 A1 | 10/2005 | Choi et al. |
| 2005/0233595 A1 | 10/2005 | Choi et al. |
| 2005/0251990 A1 | 11/2005 | Choi et al. |
| 2006/0011139 A1 | 1/2006 | Sterling et al. |
| 2006/0033106 A1 | 2/2006 | Seo et al. |
| 2006/0038182 A1 | 2/2006 | Rogers et al. |
| 2006/0043447 A1 | 3/2006 | Ishii et al. |
| 2006/0046476 A1 | 3/2006 | Nakamura et al. |
| 2006/0065299 A1 | 3/2006 | Fukawa et al. |
| 2006/0108636 A1 | 5/2006 | Sano et al. |
| 2006/0125098 A1 | 6/2006 | Hoffman et al. |
| 2006/0258064 A1 | 11/2006 | Chen et al. |
| 2006/0286725 A1 | 12/2006 | Cheng et al. |
| 2007/0007125 A1 | 1/2007 | Krasnov et al. |
| 2007/0026321 A1 | 2/2007 | Kumar |
| 2007/0029626 A1 | 2/2007 | Sakama et al. |
| 2007/0030569 A1 | 2/2007 | Lu et al. |
| 2007/0048911 A1 * | 3/2007 | Oh et al. ............... 438/151 |
| 2007/0057261 A1 | 3/2007 | Jeong et al. |
| 2007/0065962 A1 | 3/2007 | Pichler |
| 2007/0068571 A1 | 3/2007 | Li et al. |
| 2007/0093013 A1 | 4/2007 | Chua et al. |
| 2007/0141784 A1 | 6/2007 | Wager et al. |
| 2007/0194379 A1 | 8/2007 | Hosono et al. |
| 2007/0252129 A1 | 11/2007 | Yagi |
| 2007/0252147 A1 | 11/2007 | Kim et al. |
| 2007/0252152 A1 | 11/2007 | Sato et al. |
| 2008/0108198 A1 | 5/2008 | Wager et al. |
| 2008/0132009 A1 | 6/2008 | Hirai |
| 2008/0173870 A1 | 7/2008 | Kim et al. |
| 2008/0224133 A1 | 9/2008 | Park et al. |
| 2008/0264777 A1 | 10/2008 | Ye |
| 2008/0272388 A1 | 11/2008 | Ushiyama et al. |
| 2008/0308411 A1 | 12/2008 | Guo et al. |
| 2009/0023959 A1 | 1/2009 | D'Amore et al. |
| 2009/0026065 A1 | 1/2009 | Nukeaw et al. |
| 2009/0045398 A1 | 2/2009 | Kato et al. |
| 2009/0050884 A1 | 2/2009 | Ye |
| 2009/0212287 A1 | 8/2009 | Nathan et al. |
| 2009/0233424 A1 | 9/2009 | Ye |
| 2009/0236597 A1 | 9/2009 | Ye |
| 2009/0239335 A1 | 9/2009 | Akimoto et al. |
| 2009/0305461 A1 | 12/2009 | Akimoto et al. |
| 2010/0001274 A1 | 1/2010 | Ye |
| 2010/0078633 A1 | 4/2010 | Watanabe |
| 2010/0090215 A1 | 4/2010 | Lee |
| 2010/0109002 A1 | 5/2010 | Itagaki et al. |
| 2010/0117073 A1 | 5/2010 | Yamazaki et al. |
| 2010/0120197 A1 | 5/2010 | Levy et al. |
| 2010/0140611 A1 | 6/2010 | Itagaki et al. |
| 2010/0193783 A1 | 8/2010 | Yamazaki et al. |
| 2010/0252832 A1 | 10/2010 | Asano et al. |

FOREIGN PATENT DOCUMENTS

| | | |
|---|---|---|
| CN | 1700428 A | 11/2005 |
| CN | 1881549 A | 12/2006 |
| EP | 145403 A2 | 6/1985 |
| JP | 02-240637 A | 9/1990 |
| JP | 06-045354 A | 2/1994 |
| JP | 3255942 B2 | 2/2002 |
| JP | 3958605 | 5/2007 |
| KR | 1999009046 | 3/1999 |
| KR | 2001-0011855 A | 2/2001 |
| KR | 2001051193 | 6/2001 |
| KR | 10-0590925 B1 | 6/2006 |
| WO | WO-2008/133345 A1 | 11/2008 |
| WO | WO-2010/002803 | 1/2010 |

OTHER PUBLICATIONS

Ma et al., "Method of control of nitrogen content in ZnO films: Structural and photoluminescence properties", J. Vac. Sci. Technol. B 22(1), Jan./Feb. 2004, pp. 94-98.

Hoffman et al., "ZnO-based transparent thin-film transistors", Applied Physics Letters, vol. 82, No. 5, Feb. 3, 2003, pp. 733-735.

Bain et al., "Deposition and electrical properties of N-In codoped p-type ZnO films by ultrasonic spray pyrolysis", Applied Physics Letters, vol. 84, No. 4, Jan. 26, 2004, pp. 541-543.

Barnes et al., "On the formation and stability of p-type conductivity in nitrogen-doped zinc oxide", Applied Physics Letters, 86, 112112 (2005).

Hirao et al., "4.1: Distinguished Paper: High Mobility Top-Gate Zinc Oxide Thin-Film Transistors (ZnO-TFTs) for Active-Matrix Liquid Crystal Displays", SID 06 Digest (2006), pp. 18-20.

Hosano et al., "Working hypothesis to explore novel wide band gap electrically conducting amorphous oxides and examples", Journal of Non-Crystalline Solids, 198-200 (1996) pp. 165-169.

Park et al., "Highly Stable Ga2O3-In2O3-ZnO Thin-Film Transistors for AM-OLED Application", IDW '07, pp. 1775-1778.

Kwon et al., "4 inch QVGA AMOLED display driven by GaInZnO TFT", IDW '07, pp. 1783-1786.

Perkins et al., "Identification of nitrogen chemical states in N-doped ZnO via x-ray photoelectron spectroscopy", Journal of Applied Physics 97, 034907 (2005).

Yao et al., "Effects of nitrogen doping and illumination on lattice constants and conductivity behavior of zinc oxide grown by magnetron sputtering", Journal of Applied Physics 99, 123510 (2006).

Klaitabtim et al., "Growth and Characterization of Zinc Oxynitride Thin Films by Reactive Gas-Timing RF Magnetron Sputtering", Japanese Journal of Applied Physics, vol. 47, No. 1, 2008, pp. 653-656.

Lee et al., "42.2: World's Largest (15-inch) XGA AMLCD Panel Using IGZO Oxide TFT", SID 08 Digest, pp. 625-628.

Zong et al., "Structural properties of zinc nitride empty balls", Materials Letters 60 (2006), pp. 905-908.

Nomura et al., "Room-temperature fabrication of transparent flexible thin-film transistors using amorphous oxide semiconductors", Nature, vol. 432, Nov. 25, 2004, pp. 788-492.

Minami, Tadatsugu, "New n-Type Transparent Conducting Oxides", MRS Bulletin, Aug. 2000.

Zong et al., "Synthesis and thermal stability of Zn3N2 powder", Solid State Communications 132 (2004), pp. 521-525.

Kaminska et al., "Transparent p-type ZnO films obtained by oxidation of sputter-deposited Zn3N2", Solid State Communications, 135 (2005), pp. 11-15.

Son et al., "42.4L: Late-News Paper: 4 inch QVGA AMOLED Driven by the Threshold Voltage Controlled Amorphous GIZO (Ga2O3-In2O3-ZnO) TFT", SID 08 Digest, pp. 633-636.

Futushara et al., "Structural, electrical and optical properties of zinc nitride thin films prepared by reactive rf magnetron sputtering", Thin Film Solids, 322 (1998), pp. 274-281.

Carcia et al., "Transparent ZnO thin-film transistor fabricated by rf magnetron sputtering", Applied Physics Letters, col. 82, No. 7, Feb. 17, 2003, pp. 1117-1119.

Yan et al., "Control of Doping by Impurity Chemical Potentials: Predictions for p-type ZnO", Physical Review Letters, vol. 86, No. 25, Jun. 18, 2001, pp. 5723-5726.

Ohya et al., "Thin Film Transistor of ZnO Fabricated by Chemical Solution Deposition", Jpn. J. Appl. Phys., vol. 40 (2001), pp. 297-298.

Hossain, et al., "Modeling and simulation of polycrystalline ZnO thin-film transistors", Journal of Applied Physics, vol. 94, No. 12, Dec. 15, 2003, pp. 7768-7777.

Park et al., "Challenge to Future Displays: Transparent AM-OLED driven by PEALD grown ZnO TFT", IMID '07 Digest, pp. 1249-1252.

Hirao et al., "Bottom-Gate Zinc Oxide Thin-Film Transistors (ZnO TFTs) for AM-LCDs", IEEE Transactions on Electron Devices, col. 55, No. 11, Nov. 2008, pp. 3136-3142.

Zong et al., "Optical band gap of zinc nitride films prepared on quartz substrates from a zinc nitride target by reactive rf magnetron sputtering", Applied Surface Science 252 (2006), pp. 7983-7986.

Tu et al., "Nitrogen-doped p-type ZnO films prepared from nitrogen gas radio-frequency magnetron sputtering", Journal of Applied Physics 100, 053705 (2006).

Futushara et al., "Optical properties of zinc oxynitride thin films", Thin Film Solids, 317 (1998), pp. 322-325.

Ozgur, et al. "A comprehensive review of ZnO materials and devices," Journal of Applied Physics 98, 041301 (2005), American Institute of Physics.

Wang, et al. "Epitaxial growth of NH3-doped ZnO thin films on <0224> oriented sapphire substrates," Journal of Crystal Growth 255, Apr. 9, 2003, pp. 293-297.

Ye, et al. "Preparation and characteristics of p-type ZnO films by DC reactive magnetron sputtering," Journal of Crystal Growth 253, Feb. 4, 2003, pp. 258-264.

Korean Office Action dated Jul. 21, 2008 for Korean Application No. 10-2007-0066962.

Hiramatsu, et al. "Formation of TiN films with low Cl concentration by pulsed plasma chemical vapor deposition," American Vacuum Society, vol. 14, No. 3, May/Jun. 1996, pp. 1037-1040.

Son et al., "Threshold Voltage Control of Amorphous Gallium Indium Zinc Oxide TFTs by Suppressing Back-Channel Current" Electrochemical and Solid-State Letters, 12 (1) H26-H28 (2009).

Fortunato, et al. "Fully transparent ZnO thin-film transistor produced at room temperature," Advanced Materials, 2005, 17, No. 5, Mar. 6, 2005, Wiley-VCH verlag Gbmh & Co. KGaA, Weinheim, pp. 590-594.

Hiramatsu et al. "4.1: Distinguished Paper: High Mobility Top-Gate Zinc Oxide Thin-Film Transistors (ZnO-TFTs) for Active-Matrix Liquid Crystal Displays," SID 06 Digest ISSN0006-0966X/06/3701-0018-$1.00+.00, 2006, pp. 18-20.

Li et al. "Progress in semiconducting oxide-based thin-film transistors for displays," Institute of Physics, Semicon. Sci. Technol. 20 (2005), pp. 720-725.

Masuda et al. "Transparent thin film transistors using ZnO as an active channel layer and their electrical properties," Journal of Applied Physics, vol. 93, No. 3, Feb. 1, 2003, American Institute of Physics, pp. 1624-1630.

International Search Report and Written Opinion dated Aug. 8, 2008 for International Application No. PCT/US08/59638.

International Search Report and Written Opinion dated Oct. 8, 2008 for International Application No. PCT/US08/71890.

International Search Report and Written Opinion dated Oct. 15, 2007 for International Application No. PCT/US07/66166.

Search Report and Written Opinion for PCT/US2009/049084 dated Jan. 25, 2010.

Freeman et al., "Chemical and Thin-Film Strategies for New Transparent Conducting Oxides", MRS Bulletin, Aug. 2000, p. 45-51.

Jin et al., "Optical properties of transparent and heat reflecting ZnO:Al films made by reactive sputtering", Appl. Phys. Lett. 51 (3), Jul. 20, 1987, p. 149-151.

Pei et al., "Optical and electrical properties of direct-current magnetron sputtered ZnO:Al films", Journal of Applied Physics, vol. 90, No. 7, Oct. 1, 2001, p. 3432-3436.

Gordon, "Criteria for Choosing Transparent Conductors", MRS Bulletin, Aug. 2000, p. 52-57.

European search report dated Jun. 30, 2010 for European Patent Application 08797025.7.

Cao et al., "Low resistivity p-ZnO films fabricated by sol-gel spin coating", Applied Physics Letters, 88, 251116 (Jun. 2006).

Zhao et al., "Growth of nitrogen-doped p-type ZnO films by spray pyrolysis and their electrical and optical properties", Journal of Crystal Growth, 280 (May 2005), pp. 495-501.

Barnes et al., "A comparison of plasma-activated N2/O2 and N2O/O2 mixtures for use in ZnO:N. synthesis by chemical vapor deposition", Journal of Applied Physics, vol. 96, No. 12 (Dec. 2004).

Ye et al., "High mobility amorphous zinc oxynitride semiconductor material for thin film transistors", Journal of Applied Physics, 106, 074512 (2009).

Chiang et al., "High mobility transparent thin-film transistors with amorphous zinc tin oxide channel layer", Appl. Phys. Lett., 86, 013503 (2005).

Fortunato et al., "Wide-bandgap high-mobility ZnO thin-film transistors produced at room temperature", Applied Physics Letters, vol. 85, No. 13, Sep. 27, 2004, pp. 2541-2543.

Jackson et al., "High-performance flexible zinc tin oxide field-effect transistors", Applied Physics Letters, 87, 193503 (2005).

First Office Action for Chinese Patent Application No. 200880015621.X, dated Nov. 24, 2010.

Wang et al., "Fabrication and characteristics of the low-resistive p-type ZnO thin films by DC reactive magnetron sputtering", Materials Letters, vol. 60, p. 912-914, Dec. 31, 2006.

Wang, "The optical and electrical characteristics and the microstructure of Al doped zinc oxide thin films", Dept. of Information material science and engineering Gullin, vol. 25(02), p. 19-22, Apr. 20, 2005.

Li, "The growth of high quality ZnO thin films at low temperature by PECVD & study of its properties", Chinese doctoral dissertations & master's theses full-text database (doctor) basic sciences, Journal 2nd, A005-11, Dec. 15, 2002.

Search report and written opinion for PCT/US2009/047966, dated Dec. 27, 2010.

Search report and written opinion for PCT/US2009/049092 dated Dec. 27, 2010.

Lu et al., "p-type conduction in N-Al co-doped ZnO thin films", Applied Physics Letters, vol. 85, No. 15, Oct. 2004, p. 3134-3135.

Zhuge et al., "ZnO p-n homojunctions and ohmic contacts to Al-N-co-doped p-type ZnO", Applied Physics Letters, vol. 87, Aug. 2005.

dit Picard et al., "Detection of NH3 and H2S with thick film semiconductor sensors based on $Cd_{2-x}GeO_{4-x-3y}N_{2y}$ oxynitrides", Sensors and Actuators B, vol. 42, 1997, pp. 47-51.

Office Action for Chinese Patent Application No. 200880106291.5 dated Mar. 30, 2011.

International Search Report and Written Opinion for PCT/US2010/049239 dated May 4, 2011.

Office Action for Chinese Patent Application No. 200980125524.0 dated Jul. 4, 2012.

Office Action for Chinese Patent Application No. 200980125888.9 dated Jul. 27, 2012.

* cited by examiner

THIN FILM TRANSISTORS USING MULTIPLE ACTIVE CHANNEL LAYERS

CROSS-REFERENCE TO RELATED APPLICATIONS

This application is a divisional application of U.S. patent application Ser. No. 12/411,195, filed Mar. 25, 2009, which application claims benefit of U.S. Provisional Patent Application Ser. No. 61/077,831, filed Jul. 2, 2008, U.S. Provisional Patent Application Ser. No. 61/117,744, filed Nov. 25, 2008, and U.S. Provisional Patent Application Ser. No. 61/117,747, filed Nov. 25, 2008, all of which are herein incorporated by reference.

GOVERNMENT RIGHTS IN THIS INVENTION

This invention was made with Government support under Agreement No. DAAD19-02-3-0001 awarded by ARL. The Government has certain rights in the Invention.

BACKGROUND OF THE INVENTION

1. Field of the Invention

Embodiments disclosed herein generally relate to thin film transistors (TFTs) and methods of fabricating TFTs.

2. Description of the Related Art

Current interest in TFT arrays is particularly high because these devices may be used in active matrix liquid crystal displays (LCDs) of the kind often employed for computer and television flat panels. The LCDs may also contain light emitting diodes (LEDs) for back lighting. Further, organic light emitting diodes (OLEDs) have been used for active matrix displays, and these OLEDs require TFTs for addressing the activity of the displays.

TFTs made with amorphous silicon have become the key components of the flat panel display industry. Unfortunately amorphous silicon does have its limitations such as low mobility. The mobility required for OLEDs is at least 10 times higher than that achievable with amorphous silicon. In addition, OLED display is more sensitive to the $V_{th}$ shift since it is a current driven device. $V_{th}$ shift of amorphous silicon TFTs under either high current or high bias voltage is an issue to be addressed. Polysilicon, on the other hand, has a higher mobility than amorphous silicon. Polysilicon is crystalline, which leads to poor local non-uniformity. Due to the requirement of a complex annealing process to make the polysilicon film, it is more difficult and more costly to make large area display using polysilicon as opposed to amorphous silicon. Due to the limitations of amorphous silicon, OLED advancement has been slow.

In recent years, transparent TFTs have been created in which zinc oxide has been used as the active channel layer. Zinc oxide is a compound semiconductor that can be grown as a crystalline material at relatively low deposition temperatures on various substrates such as glass and plastic.

Therefore, there is a need in the art for TFTs having amorphous or non-crystalline active channels with high mobility.

SUMMARY OF THE INVENTION

Embodiments disclosed herein generally relate to TFTs and methods of fabricating the TFTs. In TFTs, the active channel layer carries the current between the source and drain electrodes. By tailoring the composition of the active channel, the current can be controlled. The active channel may be divided into three layers, a gate control layer, a bulk layer, and a back channel interface control layer. The gate control layer is the layer or a group of layers that are closest to the interface between the active channel and the gate dielectric layer. The back channel interface control layer is the layer or group of layers that are closest to the interface between the active channel and a passivation or etch stop layer. The bulk layer is the layer or group of layers in between the gate control layer and the back channel interface control layer. The separate layers may have different compositions. Each of the gate control, bulk and back channel interface control layers may additionally comprise multiple layers that may have different compositions. The composition of the various layers of the active channel comprise oxygen, nitrogen, and one or more elements selected from the group consisting of zinc, indium, cadmium, tin, gallium and combinations thereof. By varying the composition among the layers, the mobility, carrier concentration and conductivity of the various layers may be controlled to produce a TFT having desired properties. Additionally, by varying the composition among the layers, the band gap or electric field between the layers as well as the interfaces between the layers and with the gate dielectric and passivation or capping layers may be controlled to produce a TFT having desired properties.

In one embodiment, a TFT includes a gate dielectric layer disposed over a gate electrode and a substrate and an active channel coupled to the gate dielectric layer opposite the substrate. The active channel includes one or more gate control layers comprising oxygen, nitrogen, and one or more elements selected from the group consisting of zinc, indium, tin, cadmium and gallium. The one or more gate control layers have a first composition. At least one of the one or more gate control layers is in contact with the gate dielectric layer. The active channel also includes one or more bulk layers in contact with at least one of the one or more gate control layers. The one or more bulk layers comprises oxygen, nitrogen, and one or more elements selected from the group consisting of zinc, indium, tin, cadmium and gallium. The one or more bulk layers have a second composition different than the first composition. The active channel also includes one or more back channel interface control layers in contact with at least one of the one or more bulk layers. The one or more back channel interface control layers comprises oxygen, nitrogen, and one or more elements selected from the group consisting of zinc, indium, tin, cadmium and gallium. The one or more back channel interface control layers have a third composition different than one or more of the first composition and the second composition. The TFT also includes source and drain electrodes coupled to at least one of the one or more back channel interface control layers.

In another embodiment, a TFT fabrication method is disclosed. The method includes depositing a gate dielectric layer over a gate electrode and a substrate and forming an active channel over the gate dielectric layer. The forming includes depositing one or more gate control layers comprising oxygen, nitrogen, and one or more elements selected from the group consisting of zinc, indium, tin, cadmium and gallium having a first composition over the gate dielectric layer. At least one of the one or more gate control layers is in contact with the gate dielectric layer. The forming also includes depositing one or more bulk layers in contact with at least one of the one or more gate control layers. The one or more bulk layers comprises oxygen, nitrogen, and one or more elements selected from the group consisting of zinc, indium, tin, cadmium and gallium. The one or more bulk layers have a second composition different than the first composition. The forming also includes depositing one or more back channel interface control layers in contact with at least one of the one or more bulk layers. The one or more back channel interface control layers comprises oxygen, nitrogen, and one or more elements selected from the group consisting of zinc, indium, tin, cadmium and gallium. The one or more back channel interface control layers have a third composition different than one or more of the first composition and the second composition. The method also includes depositing a conductive layer on the topmost layer of the one or more back channel interface control layers and patterning the conductive layer to define source and drain electrodes and expose the topmost layer of the one or more back channel interface control layers.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments discussed herein may be performed in a physical vapor deposition (PVD) apparatus manufactured and sold by AKT America, Inc., a subsidiary of Applied Materials, Inc., Santa Clara, Calif. It is to be understood that the methods described herein may be performed in other apparatus, including those manufactured and sold by other manufacturers. The embodiments discussed herein are not to be limited to PVD, but, rather, may be practiced using other deposition methods including, but not limited to, chemical vapor deposition (CVD), plasma enhanced CVD (PECVD), pulsed laser deposition, spin-on sol-gel deposition, and atomic layer deposition (ALD).

FIGS. 1A-1G are schematic cross sectional views of a TFT 100 according to one embodiment of the invention at various stages of fabrication. The TFT may comprise a substrate 102. In one embodiment, the substrate 102 may comprise glass. In another embodiment, the substrate 102 may comprise a polymer. In another embodiment, the substrate 102 may comprise plastic. In still another embodiment, the substrate 102 may comprise metal. In another embodiment, the substrate 102 may comprise a stainless steel sheet.

Over the substrate, a gate electrode 104 may be formed. The gate electrode 104 may comprise an electrically conductive layer that controls the movement of charge carriers within the TFT. The gate electrode 104 may comprise a metal such as aluminum, molybdenum, tungsten, chromium, tantalum, or combinations thereof. The gate electrode 104 may be formed using conventional deposition techniques including sputtering, lithography, and etching. The gate electrode 104 may be formed by blanket depositing a conductive layer over the substrate 102. The conductive layer may be deposited by sputtering. Thereafter, a photoresist layer may be deposited over the conductive layer. The photoresist layer may be patterned to form a mask. The gate electrode 104 may be formed by etching away the unmasked portions of the conductive layer to leave the gate electrode 104 on the substrate 102.

Over the gate electrode 104, a gate dielectric layer 106 may be deposited. The gate dielectric layer 106 affects the sub threshold swing or slope and the threshold voltage of the TFT. For silicon based TFTs (i.e., TFTs having a silicon based semiconductor layer such as amorphous silicon), the gate dielectric layer 106 cannot comprise silicon oxide because $V_{th}$ is far away from zero volts of the gate voltage which causes the TFT to perform poorly. However, for metal oxide TFTs, it has been discovered that silicon oxide may function as an effective gate dielectric layer 106. The oxygen in the silicon oxide may not detrimentally alter the metal oxide layer and thus, the TFT may not fail. In one embodiment, the gate dielectric layer 106 may comprise silicon nitride. In another embodiment, the gate dielectric layer 106 may comprise silicon oxide. In another embodiment, the gate dielectric layer 106 may comprise silicon oxynitride. In another embodiment, the gate dielectric layer 106 may comprise $Al_2O_3$. The gate dielectric layer 106 may be deposited by well known deposition techniques including PECVD. In one embodiment, the gate dielectric layer 106 may be deposited by PVD.

After the gate dielectric layer 106 has been deposited, the gate dielectric layer 106 may be treated. One of the techniques involves exposing the gate dielectric layer 106 to a plasma 108 to passivate the surface of the gate dielectric layer 106. In one embodiment, the gate dielectric layer 106 may be exposed to a plasma comprising an oxygen containing gas such as $N_2O$ or $O_2$. In another embodiment, the gate dielectric layer 106 may be exposed to a plasma comprising $H_2$, Ar, $N_2$, or $PH_3$ after exposure to the oxygen containing plasma. In another embodiment, the gate dielectric layer 106 may be exposed to an oxygen containing gas in the absence of plasma such as $N_2O$ or $O_2$. In another embodiment, the gate dielectric layer 106 may be exposed to an oxygen containing plasma after exposure to an oxygen containing gas. In still another embodiment, a silicon oxide layer may be deposited over the gate dielectric layer 106 in addition to or instead of treating the gate dielectric layer 106.

After treating the gate dielectric layer 106, the semiconductor layer 110 may be deposited thereover. The semiconductor layer 110 will be the material that comprises the active channel in the final TFT structure. The semiconductor layer 110 may comprise oxygen, nitrogen, and one or more elements selected from the group consisting of zinc, gallium, cadmium, indium, tin, and combinations thereof. In one embodiment, the semiconductor layer 110 may comprise oxygen, nitrogen, and one or more elements having a filled s orbital and a filled d orbital. In another embodiment, the semiconductor layer 110 may comprise oxygen, nitrogen, and one or more elements having a filled f orbital. In another embodiment, the semiconductor layer 110 may comprise oxygen, nitrogen, and one or more divalent elements. In another embodiment, the semiconductor layer 110 may comprise oxygen, nitrogen, and one or more trivalent elements. In another embodiment, the semiconductor layer may comprise oxygen, nitrogen, and one or more tetravalent elements. The semiconductor layer 110 may be deposited as an amorphous layer a crystalline layer or a combination of both.

The semiconductor layer 110 may also comprise a dopant. Suitable dopants that may be used include Al, Sn, Ga, Ca, Si, Ti, Cu, Ge, In, Ni, Mn, Cr, V, Mg, $Si_xN_y$, $Al_xO_y$, and SiC. In one embodiment, the dopant comprises aluminum. In another embodiment, the dopant comprises tin.

Examples of semiconductor layer 110 include the following: $ZnO_xN_y$, $SnO_xN_y$, $InO_xN_y$, $CdO_xN_y$, $GaO_xN_y$, $ZnSnO_xN_y$, $ZnInO_xN_y$, $ZnCdO_xN_y$, $ZnGaO_xN_y$, $SnInO_xN_y$, $SnCdO_xN_y$, $SnGaO_xN_y$, $InCdO_xN_y$, $InGaO_xN_y$, $CdGaO_xN_y$, $ZnSnInO_xN_y$, $ZnSnCdO_xN_y$, $ZnSnGaO_xN_y$, $ZnInCdO_xN_y$, $ZnInGaO_xN_y$, $ZnCdGaO_xN_y$, $SnInCdO_xN_y$, $SnInGaO_xN_y$, $SnCdGaO_xN_y$, $InCdGaO_xN_y$, $ZnSnInCdO_xN_y$, $ZnSnInGaO_xN_y$, $ZnInCdGaO_xN_y$, and $SnInCdGaO_xN_y$. Examples of semiconductor layer 110 include the following doped materials: $ZnO_xN_y$:Al, $ZnO_xN_y$:Sn, $SnO_xN_y$:Al, $InO_xN_y$:Al, $InO_xN_y$:Sn, $CdO_xN_y$:Al, $CdO_xN_y$:Sn, $GaO_xN_y$:Al, $GaO_xN_y$:Sn, $ZnSnO_xN_y$:Al, $ZnInO_xN_y$:Al, $ZnInO_xN_y$:Sn, $ZnCdO_xN_y$:Al, $ZnCdO_xN_y$:Sn, $ZnGaO_xN_y$:Al, $ZnGaO_xN_y$:Sn, $SnInO_xN_y$:Al, $SnCdO_xN_y$:Al, $SnGaO_xN_y$:Al, $InCdO_xN_y$:Al, $InCdO_xN_y$:Sn, $InGaO_xN_y$:Al, $InGaO_xN_y$:Sn, $CdGaO_xN_y$:Al, $CdGaO_xN_y$:Sn, $ZnSnInO_xN_y$:Al, $ZnSnCdO_xN_y$:Al, $ZnSnGaO_xN_y$:Al, $ZnInCdO_xN_y$:Al, $ZnInCdO_xN_y$:Sn, $ZnInGaO_xN_y$:Al, $ZnInGaO_xN_y$:Sn, $ZnCdGaO_xN_y$:Al, $ZnCdGaO_xN_y$:Sn, $SnInCdO_xN_y$:Al, $SnInGaO_xN_y$:Al, $SnCdGaO_xN_y$:Al, $InCdGaO_xN_y$:Al, $InCdGaO_xN_y$:Sn, $ZnSnInCdO_xN_y$:Al, $ZnSnInGaO_xN_y$:Al, $ZnInCdGaO_xN_y$:Al, $ZnInCdGaO_xN_y$:Sn, and $SnInCdGaO_xN_y$:Al.

The semiconductor layer 110 may be deposited by sputtering. In one embodiment, the sputtering target comprises the metal such as zinc, gallium, tin, cadmium, indium, or combinations thereof. The sputtering target may additionally comprise a dopant. Oxygen containing gas and nitrogen containing gas are introduced into the chamber to deposit the semiconductor layer 110 by reactive sputtering. In one embodiment, the nitrogen containing gas comprises $N_2$. In another embodiment, the nitrogen containing gas comprises $N_2O$, $NH_3$, or combinations thereof. In one embodiment, the oxygen containing gas comprises $O_2$. In another embodiment, the oxygen containing gas comprises $N_2O$. The nitrogen of the nitrogen containing gas and the oxygen of the oxygen containing gas react with the metal from the sputtering target to form a semiconductor material comprising metal, oxygen, nitrogen, and optionally a dopant on the substrate. In one embodiment, the nitrogen containing gas and the oxygen containing gas are separate gases. In another embodiment, the nitrogen containing gas and the oxygen containing gas comprise the same gas. Additional additives such as $B_2H_6$, $CO_2$, CO, $CH_4$, and combinations thereof may also be provided to the chamber during the sputtering.

After the semiconductor layer 110 has been deposited, a conductive layer 112 may be deposited. In one embodiment, the conductive layer 112 may comprise a metal such as aluminum, tungsten, molybdenum, chromium, tantalum, and combinations thereof. The conductive layer 112 may be deposited by using PVD.

After the conductive layer 112 is deposited, the source electrode 114, the drain electrode 116, and the active channel 118 may be defined by etching away portions of the conductive layer 112. Portions of the semiconductor layer 110 may also be removed by etching. Although not shown, a capping layer (or etch stop layer) may be deposited over the semiconductor layer 110 prior to depositing the conductive layer. The etch stop layer functions to protect the active channel 118 from undue plasma exposure during etching.

Over the semiconductor layer 110 and within the active channel 118, a first capping layer 120 may be deposited. In one embodiment, the first capping layer 120 may comprise silicon oxide. In another embodiment, the first capping layer 120 may comprise silicon oxynitride. In one embodiment, the first capping layer 120 may be deposited by PECVD. In another embodiment, the first capping layer 120 may be deposited by CVD. In another embodiment, the first capping layer 120 may comprise silicon carbide. In another embodiment, the first capping layer 120 may comprise amorphous carbon.

In order to deposit the first capping layer 120, a silicon containing gas may be introduced into the processing chamber. In one embodiment, the silicon containing gas may comprise $SiH_4$. In another embodiment, the silicon containing gas may comprise TEOS. In addition to the silicon containing gas, $N_2O$, NO, $NO_2$, $O_2$, CO, $CO_2$, $NH_3$, and combinations thereof gas may also be introduced. The $N_2O$ and the silicon containing gases may be introduced at a flow ratio of $N_2O$ to silicon containing gas of between about 20:1 to about 40:1. The hydrogen and nitrogen in a traditional silicon nitride capping layer used in silicon based TFTs semiconductor layers comprising silicon) may not have enough oxygen to balance the hydrogen and nitrogen effect on the TFT and may thus cause a negative shift in the threshold voltage. The oxygen content in the first capping layer 120 may be adjusted by controlling the ratio of $SiH_4$ to $N_2O$. The oxygen content should not be too high. If the oxygen content in the first capping layer 120 is too high, the on-current ($I_{on}$) or mobility may be significantly reduced. The high oxygen content may enlarge the area of the semiconductor layer that is damaged during the source-drain patterning of the strong positive charge on that top layer that could affect the electron movement under the electric field. In addition to the silicon containing gas and the $N_2O$ gas, nitrogen gas ($N_2$) may also be introduced.

In addition to the silicon containing gas and the $N_2O$ gas, $PH_3$ gas may be introduced. Hydrogen increases the mobility of the TFT. Thus, the $PH_3$ gas may increase the mobility of the TFT due to the hydrogen present in the $PH_3$ gas. However, hydrogen can cause the threshold voltage of the TFT to shift and become more negative. Thus, the amount of hydrogen that is present in the chamber during the first capping layer 120 deposition needs to be balanced to suit the needs of the user. For example, if the user is willing to sacrifice the threshold voltage, a higher mobility may be achieved. In one embodiment, the ratio of the $PH_3$ gas to the total hydrogen content of the gases introduced into the processing chamber may be between about 1:190 to about 1:200. When depositing a carbon containing first capping layer 120, the gases that may be introduced include $N_2$, $H_2$, and carbon containing gases such as $C_2H_2$.

After the first capping layer 120 has been deposited, the first capping layer 120 may be treated. One of the techniques involves exposing the first capping layer 120 to a plasma to passivate the surface of the first capping layer 120. In one embodiment, the first capping layer 120 may be exposed to a plasma comprising an oxygen containing gas such as $N_2O$ or $O_2$. In another embodiment, the first capping layer 120 may be exposed to a plasma comprising $H_2$, Ar, $N_2$, or $PH_3$ after exposure to the oxygen containing plasma. In another embodiment, the first capping layer 120 may be exposed to an oxygen containing gas in the absence of plasma such as $N_2O$, He, $H_2$, $N_2$, $O_2$, or combinations thereof. In another embodiment, the first capping layer 120 may be exposed to an oxygen containing plasma after exposure to an oxygen containing gas.

A second capping layer 122 may be deposited over the first capping layer 120. In one embodiment, the second capping layer 122 has a different composition than the first capping layer 120. In another embodiment, the second capping layer 122 has the same composition as the first capping layer 120.

When the first capping layer 120 and the second capping layer 122 have the same composition, the first capping layer 120 and the second capping layer 122 may be deposited in a single deposition step. In one embodiment, the first capping layer 120 and the second capping layer 122 comprise a single layer deposited in a single processing step with a composition gradient that changes throughout the layer such that the oxygen content at the interface with the semiconductor layer 110 in the active channel 118 is higher than the oxygen content throughout the remainder of the layer. Of the collective thickness of the first and second capping layers 120, 122, the first capping layer may comprise about 5 percent to about 20 percent of the total thickness. In one embodiment, the thickness of the first capping layer 120 may be between about 75 Angstroms to about 125 Angstroms.

After the second capping layer 122 has been deposited, the second capping layer 122 may be treated. One of the techniques involves exposing the second capping layer 122 to a plasma to passivate the surface of the second capping layer 122. In one embodiment, the second capping layer 122 may be exposed to a plasma comprising an oxygen containing gas such as $N_2O$ or $O_2$. In another embodiment, the second capping layer 122 may be exposed to a plasma comprising $H_2$, Ar, $N_2$, or $PH_3$ after exposure to the oxygen containing plasma. In another embodiment, the second capping layer 122 may be exposed to an oxygen containing gas in the absence of plasma such as $N_2O$ or $O_2$. In another embodiment, the second capping layer 122 may be exposed to an oxygen containing plasma after exposure to an oxygen containing gas.

Figure 1A:
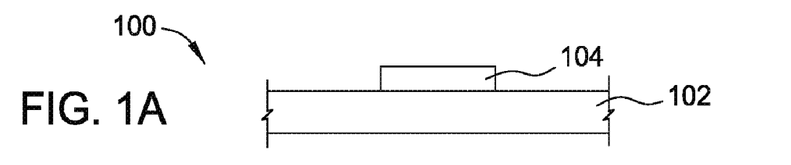
FIGS. 1A-1G are schematic cross sectional views of a TFT 100 according to one embodiment of the invention at various stages of fabrication.
Figure 1B:
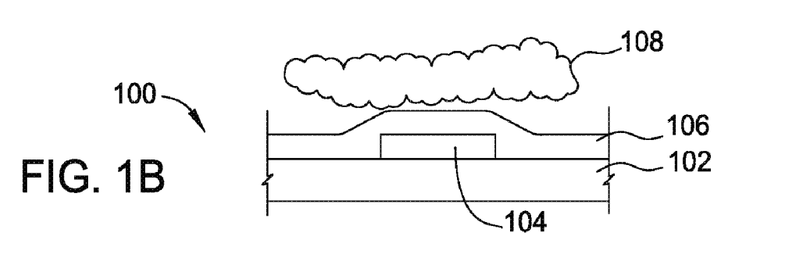
Figure 1C:
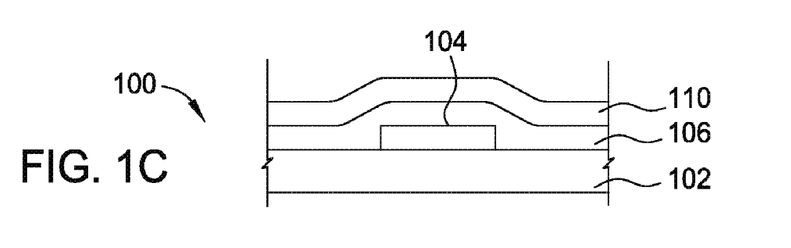
Figure 1D:
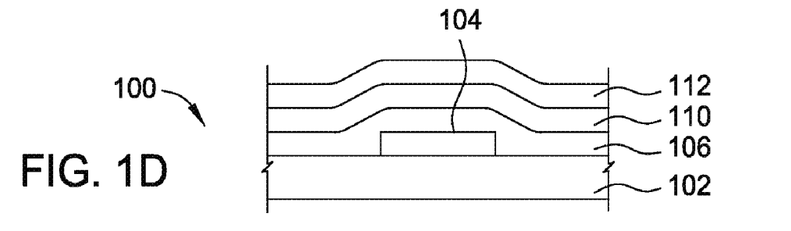
Figure 1E:
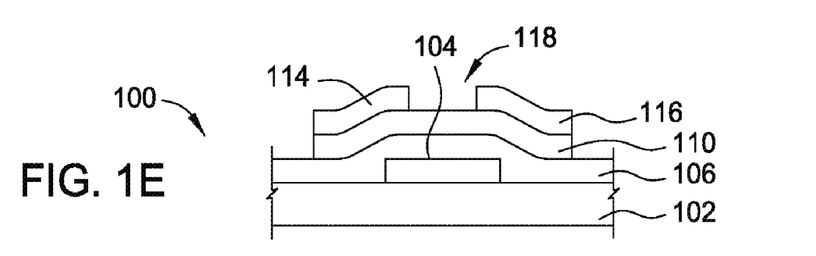
Figure 1F:
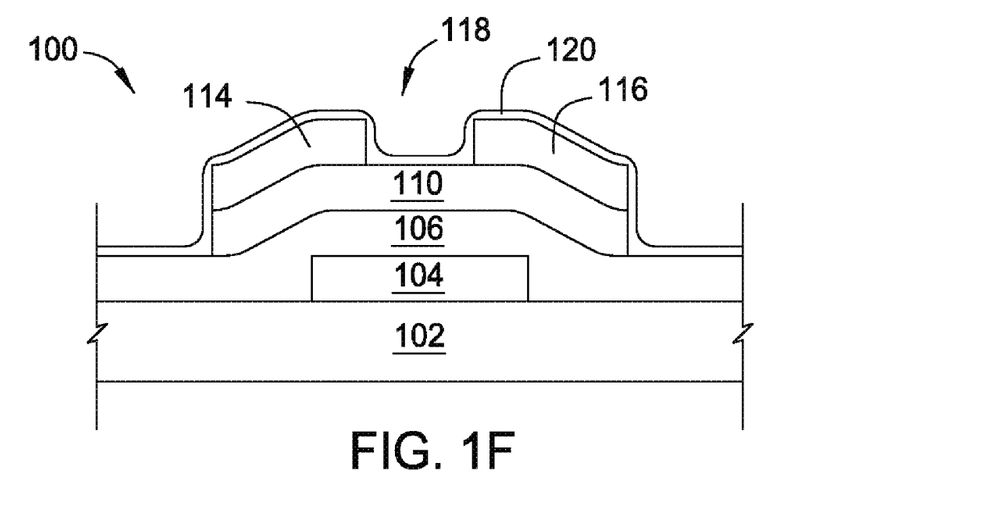
Figure 1G:
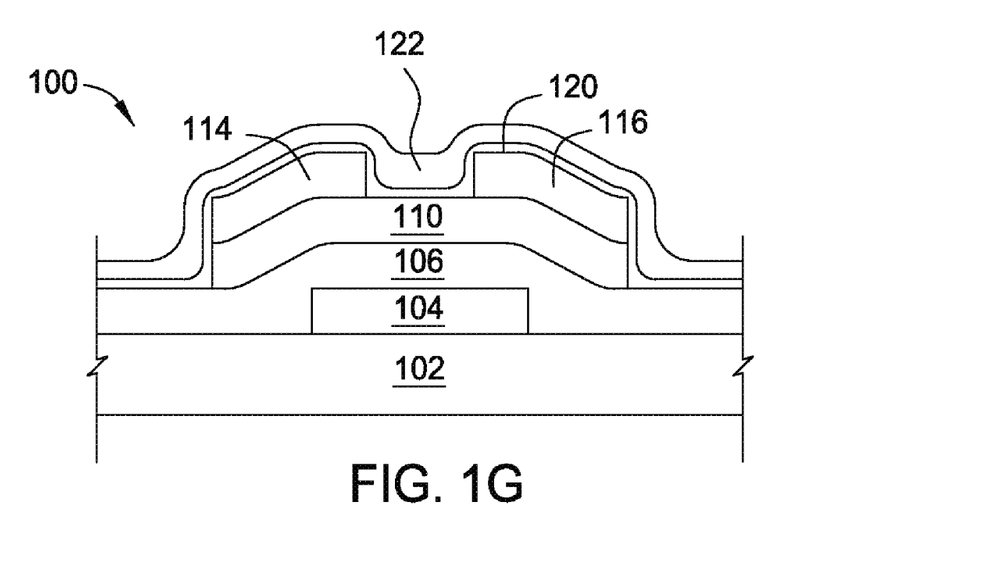

As shown in FIG. 1G, the active channel 118 interfaces with the gate dielectric layer 106, the first capping layer 120, the source electrode 114 and the drain electrode 116. Thus, the active channel 118 needs to be quite versatile due to the different carrier concentration, mobility, band gap, conductivity, etc. of the various layers. If an active channel is silicon based, highly doped silicon is used to improve the contact resistance between the active layer and the metal electrode rather than simply silicon.

It has surprisingly been found that when the active channel comprises oxygen, nitrogen, and one or more elements selected from the group consisting of zinc, cadmium, tin, indium and gallium, the characteristics of the active channel may be tailored to suit the needs of the user. For example, rather than simply one layer, the active channel may comprise multiple layers, each having different semiconductor properties such as carrier concentration, mobility, band gap, conductivity, and composition, even while the layers each have oxygen, nitrogen, and one or more elements selected from the group consisting of zinc, cadmium, tin, indium and gallium. In one embodiment, the multiple layers for the active channel may even have different elements. The purpose of the multiple layers is to accommodate the interface between the active layer and the gate dielectric layer and also between the active layer and the capping layer. The multiple layers adjust the potential created in the active layers for achievement of the best possible performance. The multiple active layers may be used to create a barrier to stop diffusion of undesired species or attach from undesired process conditions.

Figure 2:
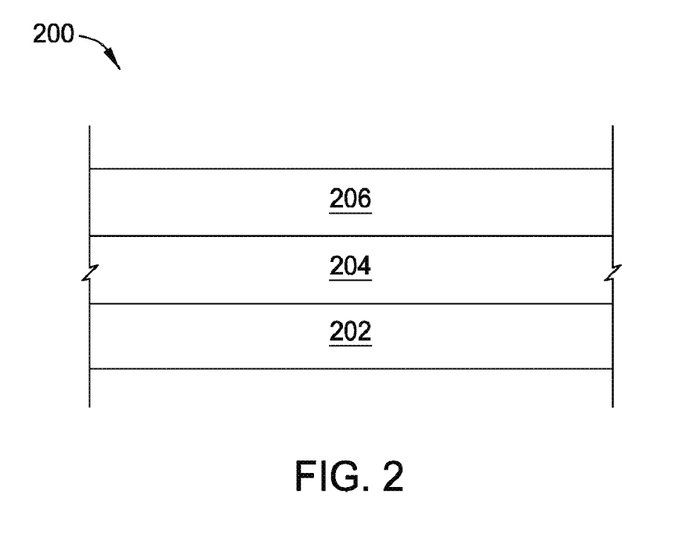
FIG. 2 is a schematic cross sectional view of an active channel 200 according to one embodiment.

FIG. 2 is a schematic cross sectional view of an active channel 200 according to one embodiment. The active channel 200 comprises three layers, a gate control layer 202 that is adjacent the gate dielectric layer, a bulk layer 204, and an back channel interface control layer 206 that is adjacent the source electrode, drain electrode, and capping layer. Each of the gate control layer 202, bulk layer 204 and back channel interface control layer 206 may have different semiconductor properties such as carrier concentration, mobility, band gap, crystal orientation, crystal fraction or chemical composition. The change in properties between the layers may be abrupt or gradual. Additionally, the thickness of the layers may not be uniform in one embodiment.

The gate control layer 202 is the layer through which, ideally, most of the current will flow. Therefore, the current through the gate control layer 202 is much greater than the current through the bulk layer 204 and the back channel interface control layer 206. In one embodiment, the gate control layer 202 may have a thickness between about 10 Angstroms to about 100 Angstroms. In another embodiment, the gate control layer 202 may have a thickness between about 50 Angstroms to about 100 Angstroms. Due to the interface with the gate dielectric layer, the gate control layer 202 may have a high mobility relative to the bulk layer 204 and interface control layer 206. In one embodiment, the gate control layer 202 may comprise a single layer. In one embodiment, the single gate control layer 202 may be graded throughout the layers such that the composition, concentration, mobility, band gap, crystal orientation or crystal fraction varies through the layer. The varying may occur as a result of utilizing different gas additives during the deposition of the gate control layer 202 or different amount of the various processing gases during deposition of the gate control layer 202.

In another embodiment, the gate control layer 202 may be broken up into multiple layers. The multiple layers may have may have different semiconductor properties such as carrier concentration, mobility, band gap, crystal orientation, crystal fraction or chemical composition, and even different thicknesses. A high or low conductivity layer may be used as one of the layers of the multi-layer gate control layer 202. A layer having high or low carrier concentration may be used as one of the layers of the multi-layer gate control layer 202. A layer having a different band gap may be used as one of the layers of the multi-layer gate control layer 202.

Prior to depositing the gate control layer 202, either as a single layer or as a multi-layer structure, the sputtering target may be seasoned for a period of time. In one embodiment, the period of time may be about 30 seconds. The target may be seasoned by delivering DC power to the target for the predetermined period of time while providing processing gases such as argon, nitrogen and ammonia. In one embodiment, the ratio of argon to ammonia may be about 12:1. In another embodiment, the ratio of nitrogen to ammonia may be about 50:1. In another embodiment, the ratio of argon to nitrogen may be about 12:5. The processing chamber may be maintained at a temperature of between about 100 degrees Celsius to about 300 degrees Celsius. In another embodiment, the processing chamber may be maintained at a temperature between about 180 degrees Celsius to about 200 degrees Celsius.

After depositing the gate control layer 202, the bulk layer 204 may be deposited. The bulk layer 204 may have low conductivity along the channel between the source and drain electrodes and high conductivity between the gate control layer and the source and drain electrodes. There may be low local charge trapping in the bulk layer 204. The bulk layer 204 may be deposited as a single layer. In one embodiment, the bulk layer 204 may be graded with a change in mobility, composition, carrier concentration, conductivity or band gap through the layer. In another embodiment, the bulk layer 204 may comprise a plurality of layers. In one embodiment, one of the layers of the multi-layer bulk layer may have either high or low conductivity so that the multi-layer bulk layer alternates between high and low conductivity (i.e., high-low-high or low-high-low conductive layers). In another embodiment, one of the layers of a multi-layer bulk layer may have either a high or low carrier concentration (i.e., high-low-high or low-high-low carrier concentration layers). In another embodiment, one of the layers of a multi-layer bulk layer may have a different band gap. In one embodiment, the bulk layer 204 may have a total thickness of between about 200 Angstroms and about 300 Angstroms. When the bulk layer 204 comprises multiple layers, the multiple layers may have may have different semiconductor properties such as carrier concentration, mobility, band gap, crystal orientation, crystal fraction or chemical composition, and even different thicknesses.

Following deposition of the bulk layer 204, the back channel interface control layer 206 may be deposited. In one embodiment, the back channel interface control layer 206 may have a thickness between about 50 angstroms and about 200 Angstroms. The back channel interface control layer 206 may cause less trapping between the channel material and the passivation or capping layer. A low conductivity in the back channel interface control layer 206 results in a low conductivity between the source and drain electrodes and a high conductivity between the gate control layer 202 and the source and drain electrodes. Less local charge trapping may occur in the back channel interface control layer 206 and between the interface control layer 206 and the bulk layer 204. The back channel interface control layer 206 also protects the bulk layer 204 and the gate control layer 202 from diffusion of any undesired species.

The back channel interface control layer 206 may comprise a single layer. When the back channel interface control layer 206 is a single layer, the layer may be graded. In one embodiment, the back channel interface control layer 206 may comprise multiple layers. The multiple layers may have may have different semiconductor properties such as carrier concentration, mobility, band gap, crystal orientation, crystal fraction or chemical composition, and even different thicknesses. When multiple layers are used, a high or low conductivity layer may be inserted or a layer having high or low carrier concentration or a layer with a different band gap may be inserted into the multi-layer structure of the back channel interface control layer 206. The last layer of the multi-layer back channel interface control layer 206 (when deposited as a multi-layer) may be deposited using different gas additives than used for the bulk layer 204 or the gate control layer 202. The last layer may have either a high or low conductivity, carrier concentration, or band gap. In one embodiment, the back channel interface control layer 206 may be partially or completely converted to have film properties that are different in the area of the active channel as compared to the area in contact with the source and drain electrodes.

Figure 3:
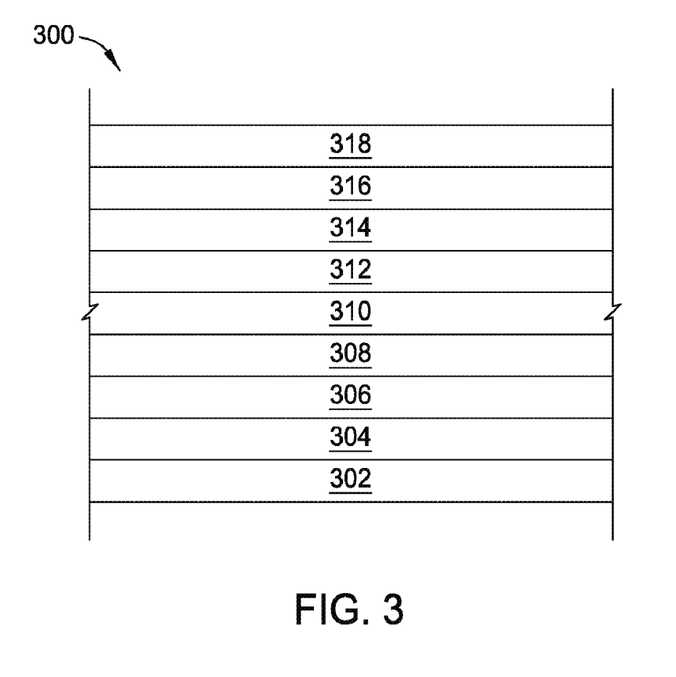
FIG. 3 is a schematic cross sectional view of an active channel 300 according to another embodiment.

FIG. 3 is a schematic cross sectional view of an active channel 300 according to another embodiment. The active channel 300 shown in FIG. 3 has three layers 302, 304, 306 that comprise the gate control layer, three layers 308, 310, 312 that comprise the bulk layer, and three layers 314, 316, 318 that comprise the back channel interface control layer. It is to be understood that while three layers have been shown for each of the gate control, bulk and back channel interface control layers, more or less layers may be present. The thicknesses, carrier concentration, mobility, band gap, crystal orientation, crystal fraction or chemical composition, may be different among the layers.

TABLE I

| Time Period | Power W | Time sec | Argon sccm | $N_2$ sccm | $N_2O$ sccm | $NH_3$ sccm |
|---|---|---|---|---|---|---|
| A | 500 | 30 | 120 | 500 | 0 | 10 |
| B | 10 | 12 | 120 | 500 | 0 | 0 |
| 1 | 500 | 30 | 120 | 500 | 0 | 0 |
| 2 | 500 | 36 | 120 | 500 | 40 | 0 |
| 3 | 500 | 24 | 120 | 500 | 0 | 0 |
| 4 | 500 | 30 | 120 | 500 | 30 | 0 |
| 5 | 500 | 24 | 120 | 500 | 0 | 0 |
| 6 | 500 | 300 | 120 | 500 | 30 | 0 |
| 7 | 1000 | 24 | 120 | 500 | 30 | 0 |
| 8 | 1000 | 24 | 120 | 500 | 40 | 0 |
| 9 | 1000 | 24 | 120 | 500 | 50 | 0 |

Table I shows processing conditions for forming a multi-layer active channel according to one embodiment. All of the layers were deposited by DC sputtering a zinc target doped with 2.2 atomic percent Sn and having an area of about 4650 square centimeters in a chamber having a volume of about 70,000 cubic centimeters. In time period A, the sputtering target is seasoned. In time period B, the gas is transitioned from the seasoning step to the deposition step for depositing the gate control layer. Time periods 1-5 are for the deposition of the gate control layers. Time period 6 is for the bulk layer, and time periods 7-9 are for the back channel interface control layers.

In time period 1, the initial layer of the gate control layer is deposited. Then, in time period 2, a high oxidation layer is deposited by introducing nitrous oxide in addition to the nitrogen and argon gases. Then, in time period 3, the nitrous oxide is stopped and the argon and nitrogen continues to flow. In time period 4, nitrous oxide is again introduced, but at a lower flow rate than in time period 3. Thus, while the layer deposited in time period 4 has a higher oxidation than the layer deposited in time periods 1 and 3, the oxidation is less than in time period 2. In time period 5, a transition layer is deposited to transition to the bulk layer.

After the bulk layer is deposited, the back channel interface control layers are deposited. During the deposition of the back channel interface control layers, the nitrous oxide provided is gradually increased to create an oxidation gradient through the layers. Additionally, the power applied is double the power applied during the gate control and bulk layer depositions.

TABLE II

| Time Period | Power W | Time sec | Argon sccm | $N_2$ sccm | $N_2O$ sccm | $NH_3$ sccm |
|---|---|---|---|---|---|---|
| 1 | 500 | 30 | 120 | 500 | 0 | 0 |
| 2 | 500 | 36 | 120 | 500 | 13 | 0 |
| 3 | 500 | 18 | 120 | 500 | 0 | 0 |
| 4 | 500 | 18 | 120 | 500 | 30 | 0 |
| 5 | 1500 | 12 | 120 | 500 | 30 | 0 |
| 6 | 800 | 18 | 120 | 500 | 30 | 0 |
| 7 | 500 | 300 | 120 | 500 | 30 | 0 |
| 8 | 1000 | 24 | 120 | 500 | 30 | 0 |
| 9 | 1000 | 24 | 120 | 500 | 40 | 0 |
| 10 | 1000 | 24 | 120 | 500 | 50 | 0 |
| 11 | 1000 | 24 | 120 | 500 | 60 | 0 |
| 12 | 1000 | 24 | 120 | 500 | 70 | 0 |
| 13 | 500 | 60 | 120 | 500 | 0 | 0 |

Table II shows processing conditions for forming a multi-layer active channel according to another embodiment. All of the layers were deposited by DC sputtering a zinc target doped with 2.2 atomic percent Sn and having an area of about 4650 square centimeters in a chamber having a volume of about 70,000 cubic centimeters. Time periods 1-6 are for the deposition of the gate control layers. Time period 7 is for the bulk layer, and time periods 8-13 are for the back channel interface control layers.

During time period 1, the initial layer of the gate control layer is deposited. Then, in time period 2, a low oxidation layer is deposited by introducing a small amount of nitrous oxide. Then, in time period 3, the nitrous oxide is discontinued. In time period 4, a high oxidization layer is deposited by introducing nitrous oxide again, but at a higher flow rate than in time period 3. In time period 5, the power is ramped up while the nitrous oxide continues to flow. Then, in time period 6, a transition layer is deposited to transition from the gate control to the bulk layer.

After the bulk layer is deposited, the back channel interface control layers are deposited. The amount of nitrous oxide is ramped up gradually while the argon, nitrogen, and power are held constant so that the interface control layers are graded. The final layer of the back channel interface control layers is the termination layer and is deposited without nitrous oxide and at a lower power.

TABLE III

| Time Period | Power W | Time sec | Argon sccm | $N_2$ sccm | $N_2O$ sccm | $NH_3$ sccm |
|---|---|---|---|---|---|---|
| A | 500 | 30 | 120 | 500 | 0 | 10 |
| 1 | 2300 | 30 | 120 | 500 | 30 | 0 |
| 2 | 500 | 18 | 120 | 500 | 0 | 0 |
| 3 | 800 | 30 | 120 | 500 | 30 | 0 |
| 4 | 1800 | 24 | 120 | 500 | 30 | 0 |
| 5 | 500 | 30 | 120 | 500 | 30 | 0 |
| 6 | 1500 | 24 | 120 | 500 | 30 | 0 |
| 7 | 500 | 30 | 120 | 500 | 30 | 0 |
| 8 | 1000 | 18 | 120 | 500 | 30 | 0 |
| 9 | 500 | 240 | 120 | 500 | 30 | 0 |
| 10 | 1000 | 24 | 120 | 500 | 30 | 0 |
| 11 | 1000 | 24 | 120 | 500 | 40 | 0 |
| 12 | 1000 | 24 | 120 | 500 | 50 | 0 |
| 13 | 1000 | 24 | 120 | 500 | 60 | 0 |
| 14 | 1000 | 24 | 120 | 500 | 70 | 0 |
| 15 | 1000 | 24 | 120 | 500 | 80 | 0 |

Table III shows processing conditions for forming a multi-layer active channel according to another embodiment. All of the layers were deposited by DC sputtering a zinc target doped with 2.2 atomic percent Sn and having an area of about 4650 square centimeters in a chamber having a volume of about 70,000 cubic centimeters. In time period A, the sputtering target is seasoned. Time periods 1-7 are for the deposition of the gate control layers. Time periods 8-10 are for the bulk layers, and time periods 11-15 are for the back channel interface control layers.

During time period 1, the ammonia from the target seasoning is discontinued, nitrous oxide is introduced and the power is ramped up to deposit the initial layer of the gate control layers. Then, in time period 2, the nitrous oxide is stopped and the power level is dropped. Then, in time period 3, the nitrous oxide is introduced again and the power is ramped up a bit. In time periods 4-7, the nitrous oxide is continued at the same rate while the power varies. In time period 3, a low conductivity layer is deposited. Then, in time period 4, a layer is deposited at a higher power level. Then, in time period 5, another low conductivity layer is deposited followed by another layer deposited at a higher power level in time period 6. In time period 7, the transition layer is deposited to transition from the gate control to the bulk layers.

In time period 8, the first bulk layer is deposited. In between time period 8 and time period 10, which are essentially the deposition conditions, a layer is deposited at a lower power. Following deposition of the bulk layers, the back channel interface control layers are deposited. During the back channel interface control deposition, the nitrous oxide is gradually increased during time periods 11-15.

By depositing multiple layers instead of a single layer, the active channel may be tailored to suit the needs to the user and a more stable TFT may be produced.

While the foregoing is directed to embodiments of the present invention, other and further embodiments of the invention may be devised without departing from the basic scope thereof, and the scope thereof is determined by the claims that follow.

The invention claimed is:

1. A thin film transistor fabrication method, comprising:
depositing a gate dielectric layer over a gate electrode and a substrate;
forming an active channel over the gate dielectric layer, the forming comprising:
depositing one or more gate control layers comprising oxygen, nitrogen, and one or more elements selected from the group consisting of zinc, indium, tin, cadmium and gallium having a first composition, at least one or the one or more gate control layers is in contact with the gate dielectric layer;
depositing one or more bulk layers in contact with at least one of the one or more gate control layers, the one or more bulk layers comprising oxygen, nitrogen, and one or more elements selected from the group consisting of zinc, indium, tin, cadmium and gallium having a second composition different than the first composition; and
depositing one or more back channel interface control layers in contact with at least one of the one or more bulk layers, the one or more back channel interface control layers comprising oxygen, nitrogen, and one or more elements selected from the group consisting of zinc, indium, tin, cadmium and gallium having a third composition different than one or more of the first composition and the second composition;
depositing a conductive layer on the topmost layer of the one or more back channel interface control layers; and
patterning the conductive layer to define source and drain electrodes and expose the topmost layer of the one or more back channel interface control layers.

2. The method of claim 1, wherein the one or more gate control layers collectively have a first thickness, the one or more bulk layers collectively have a second thickness, and the one or more back channel interface control layers collectively have a third thickness, and wherein the second thickness is greater than the third thickness and the third thickness greater than the first thickness.

3. The method of claim 2, wherein the one or more gate control layers have a first mobility, the one or more bulk layers have a second mobility and the one or more back channel interface control layers have a third mobility, and wherein the first mobility, the second mobility, and the third mobility are different.

4. The method of claim 3, wherein the one or more gate control layers have a first conductivity, the one or more bulk layers have a second conductivity and the one or more back channel interface control layers have a third conductivity, and wherein the first conductivity, the second conductivity, and the third conductivity are different.

5. The method of claim 1, wherein the one or more gate control layers comprises a plurality of layers.

6. The method of claim 5, wherein the one or more back channel interface control layers comprises a plurality of layers.

7. The method of claim 1, wherein depositing one or more gate control layers comprises introducing argon, a nitrogen containing gas and an oxygen containing gas into a sputtering chamber and sputtering a zinc containing target.

8. The method of claim 7, wherein the oxygen containing gas comprises nitrous oxide and the nitrogen containing gas comprises nitrogen.

9. The method of claim 8, wherein the one or more gate control layers comprises a plurality of layers and wherein the composition of at least two of the gate control layers is different.

10. The method of claim 1, wherein depositing one or more bulk layers comprises introducing argon, a nitrogen containing gas and an oxygen containing gas into a sputtering chamber and sputtering a zinc containing target.

11. The method of claim 10, wherein the oxygen containing gas comprises nitrous oxide and the nitrogen containing gas comprises nitrogen.

12. The method of claim 11, wherein the one or more bulk layers comprise a plurality of layers and wherein the composition of at least two of the bulk layers is different.

13. The method of claim 1, wherein depositing one or more back channel interface control layers comprises introducing argon, a nitrogen containing gas and an oxygen containing gas into a sputtering chamber and sputtering a zinc containing target.

14. The method of claim 13, wherein the oxygen containing gas comprises nitrous oxide and the nitrogen containing gas comprises nitrogen.

15. The method of claim 14, wherein the one or more back channel interface control layers comprises a plurality of layers and wherein the composition of at least two of the back channel interface control layers is different.

* * * * *